United States Patent
Thomas et al.

(10) Patent No.: US 10,937,664 B2
(45) Date of Patent: Mar. 2, 2021

(54) SURFACE MODIFICATION PROCESS

(71) Applicant: Tokyo Electron Limited, Tokyo (JP)

(72) Inventors: Cedric Thomas, Taiwa-cho (JP); Andrew Nolan, Taiwa-cho (JP); Alok Ranjan, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/558,865

(22) Filed: Sep. 3, 2019

(65) Prior Publication Data

US 2020/0075734 A1 Mar. 5, 2020

Related U.S. Application Data

(60) Provisional application No. 62/727,167, filed on Sep. 5, 2018.

(51) Int. Cl.
| | |
|---|---|
| *H01L 21/3213* | (2006.01) |
| *H01L 29/40* | (2006.01) |
| *H01L 21/033* | (2006.01) |
| *H01L 29/66* | (2006.01) |
| *H01L 21/02* | (2006.01) |

(52) U.S. Cl.
CPC .. *H01L 21/32139* (2013.01); *H01L 21/02274* (2013.01); *H01L 21/0337* (2013.01); *H01L 29/401* (2013.01); *H01L 29/66795* (2013.01); *H01L 29/66818* (2013.01)

(58) Field of Classification Search
None
See application file for complete search history.

(56) References Cited

U.S. PATENT DOCUMENTS

| | | | |
|---|---|---|---|
| 2007/0202700 A1 | 8/2007 | Leucke et al. | |
| 2012/0208371 A1* | 8/2012 | Rogers | H01J 37/321 |
| | | | 438/758 |
| 2012/0220135 A1 | 8/2012 | Nakagawa et al. | |

(Continued)

FOREIGN PATENT DOCUMENTS

KR 10-2012-0063661 A1 6/2012

OTHER PUBLICATIONS

International Search Report and Written Opinion dated Dec. 18, 2019 in PCT/US2019/049298 (12 pages).

*Primary Examiner* — Jiong-Ping Lu
(74) *Attorney, Agent, or Firm* — Rothwell, Figg, Ernst & Manbeck, P.C.

(57) ABSTRACT

Methods and systems for surface modification are described. In an embodiment, a method of etching includes providing a substrate having a device structure, portions of which are identified for modification. Such a method may also include passivating target surfaces of the device structure by exposing the device structure to a gas-phase composition at a processing pressure equal to or greater than 100 mTorr to form a protection layer on the target surfaces. Other embodiments of a method may include providing a substrate having a device structure, portions of which identified for removal. Such methods may further include passivating target surfaces of the device structure by exposing the device structure to a gas-phase composition, wherein the ratio of the radical content to the ion content exceeds 10-to-1.

17 Claims, 8 Drawing Sheets

(56) References Cited

U.S. PATENT DOCUMENTS

2013/0237059 A1\* 9/2013 Ranjan ............... H01L 21/0337
                                                    438/696
2017/0178920 A1\* 6/2017 Dole ................ H01L 21/31116
2018/0151565 A1   5/2018 Lee et al.

\* cited by examiner

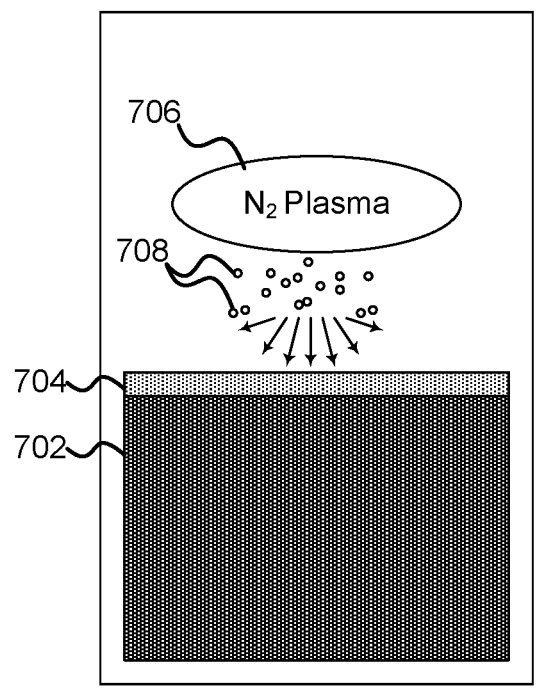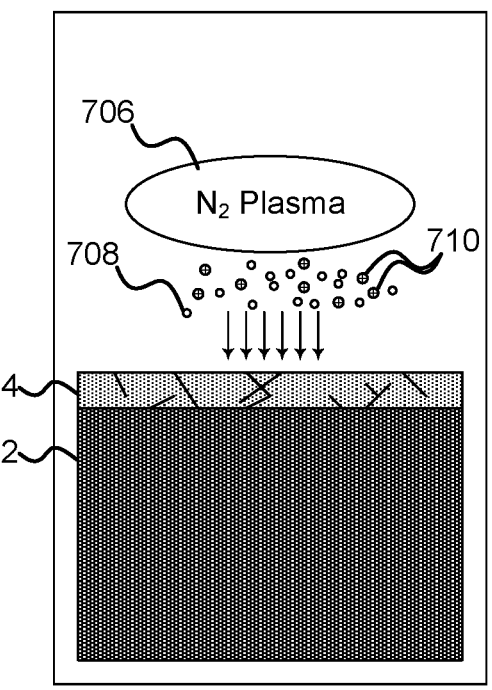
*FIG. 7A*  *FIG. 7B*

SURFACE MODIFICATION PROCESS

CROSS-REFERENCE TO RELATED APPLICATIONS

This application claims priority to U.S. Provisional Application No. 62/727,167 filed on Sep. 5, 2018 which is hereby incorporated by reference in its entirety.

FIELD OF INVENTION

The invention relates to a method for etching, and more particularly, methods and systems for surface modification to reduce side wall etch.

BACKGROUND OF THE INVENTION

The present invention relates to a method of manufacturing a semiconductor device such as an integrated circuit. An integrated circuit may include transistors and transistor components. In the manufacture of a semiconductor device, various fabrication processes are executed such as film-forming depositions, etch mask creation, patterning, material etching and removal, and doping treatments. Such processes are performed, sometimes repeatedly, to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other.

As device structures densify and develop vertically, the need for precision material etch becomes more compelling. Trade-offs between selectivity, profile, aspect ratio dependent etching (ARDE), and uniformity in plasma etch processes become difficult to manage. Current approaches to patterning and pattern transfer by balancing these trade-offs is not sustainable. The root cause for these trade-offs is the inability to control ion energy, ion flux, and radical flux independently. However, modulated processes that exploit the benefits of different process regimes have been shown to achieve acceptable, and even superior, etch process attributes.

SUMMARY

Methods and systems for surface modification to reduce side wall etch are described. In an embodiment, a method of etching includes providing a substrate having a device structure, portions of which are identified for removal. Such a method may also include passivating target surfaces of the device structure by exposing the device structure to a gas-phase composition at a processing pressure equal to or greater than 100 mTorr to form a protection layer on the target surfaces.

Other embodiments of a method may include providing a substrate having a device structure, portions of which are identified for removal. Such methods may further include passivating target surfaces of the device structure by exposing the device structure to a gas-phase composition, wherein the ratio of the radical content to the ion content exceeds 10-to-1.

Corresponding systems that are specially designed to perform the methods described herein are also presented. Such systems may include processing chambers, process controllers, and other components that are either specifically designed for the described processes, or specially configured to carry out the described processes.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

In the accompanying drawings:

FIG. 7A illustrates one embodiment of a surface modification process.

FIG. 7B illustrates one embodiment of a surface modification process.

DETAILED DESCRIPTION

Techniques herein pertain to device fabrication using precision etch techniques. Several instances manifest in semiconductor manufacturing in both front end of line (FEOL, e.g., transistor fabrication) through to the back end of line (BEOL, e.g., interconnect fabrication), where oxide and nitride films (typically silicon-containing, in nature) need to be etched with a high degree of precision.

Numerous fabrication sequences in semiconductor manufacturing demand precision etch techniques. Examples, which will be discussed later, include: (1) gate spacer etch for both 2D (two-dimensional) and 3D (three-dimensional) device structures, (2) spacer etch for sidewall image transfer (SIT) for multi-patterning, (3) mandrel removal from a post-spacer etch SIT structure, and (4) liner etch from a raised structure.

During formation of various features on and/or in a semiconductor substrate, various etch steps are required. Various etch techniques may be used, including wet etch and dry reactive ion etch (DRIE). Wet etch processes often include use of corrosive chemicals to etch away certain materials on the surface of the substrate. Wet etch processes are typically isotropic, meaning that the etch occurs in all directions. DRIE processes or typically more anisotropic than wet etch processes, meaning that DRIE etch processes can form features, such as protrusions or trenches, with walls that are substantially perpendicular to a surface of the substrate, or vertical with respect to the broad surface of the substrate. Anisotropic etch processes may be referred to as "directional" etch processes, because the etch primarily occurs in one direction with respect to the surface of the substrate.

Not all dry etch processes are anisotropic. Depending upon the material to be etched, and the chemistry of gas mixtures in the etch plasma, certain dry etch processes may cause "under-etch" of certain layers or features, meaning that the walls formed are not exactly perpendicular and straight with respect to the broad surface of the substrate. One such example may occur during the formation of a transistor gate feature on a surface of a substrate. The present embodiments provide methods and systems for reducing side wall etch of features in the substrate that occurs due to isotropic etch during feature formation processes. The present embodiments are particularly helpful with respect to formation of transistor gate features.

Figure 1:
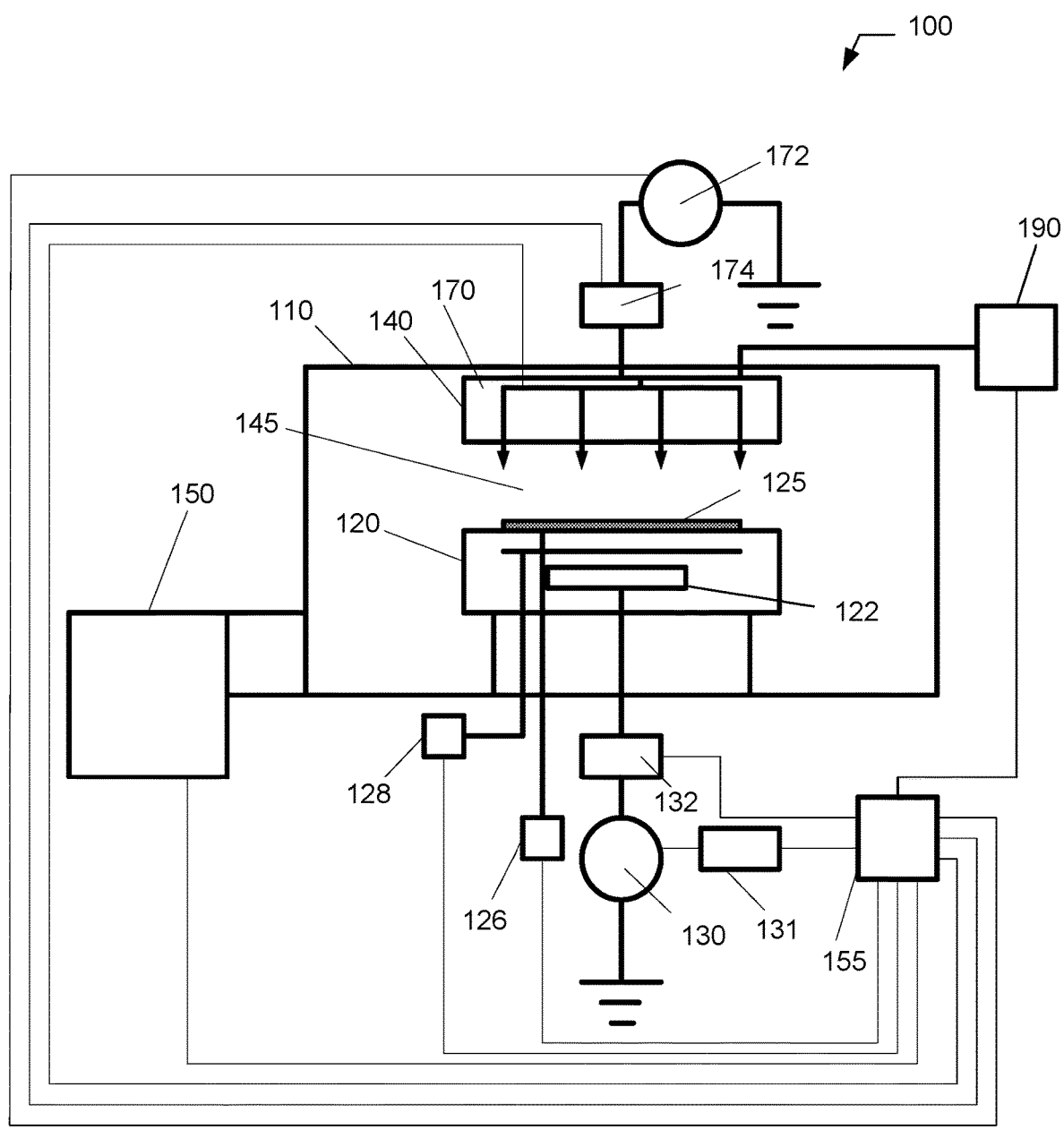
FIG. 1 is a schematic block diagram illustrating one embodiment of an etch system configured to perform methods for surface modification to reduce side wall etch.

FIG. 1 is an embodiment of a system 100 for surface modification to reduce side wall etch. In a further embodiment, the system 100 may be configured to perform patterning of low aspect ratio stacks as described with reference to FIGS. 2A-6D. An etch and plasma-assisted deposition system 100 configured to perform the above identified process conditions is depicted in FIG. 1 comprising a processing chamber 110, substrate holder 120, upon which a wafer 125 to be processed is affixed, and vacuum pumping system 150. The wafer 125 can be a semiconductor substrate, a wafer, a flat panel display, or a liquid crystal display. Processing chamber 110 can be configured to facilitate etching the processing region 145 in the vicinity of a surface of the wafer 125. An ionizable gas or mixture of process gases is introduced via a gas distribution system 140. For a given flow of process gas, the process pressure is adjusted using the vacuum pumping system 150.

The wafer 125 can be affixed to the substrate holder 120 via a clamping system (not shown), such as a mechanical clamping system or an electrical clamping system (e.g., an electrostatic clamping system). Furthermore, substrate holder 120 can include a heating system (not shown) or a cooling system (not shown) that is configured to adjust and/or control the temperature of substrate holder 120 and the wafer 125. The heating system or cooling system may comprise a re-circulating flow of heat transfer fluid that receives heat from substrate holder 120 and transfers heat to a heat exchanger system (not shown) when cooling, or transfers heat from the heat exchanger system to substrate holder 120 when heating. In other embodiments, heating/cooling elements, such as resistive heating elements, or thermo-electric heaters/coolers can be included in the substrate holder 120, as well as the chamber wall of the processing chamber 110 and any other component within the processing system 100.

Additionally, a heat transfer gas can be delivered to the backside of wafer 125 via a backside gas supply system 126 in order to improve the gas-gap thermal conductance between wafer 125 and substrate holder 120. Such a system can be utilized when temperature control of the wafer 125 is required at elevated or reduced temperatures. For example, the backside gas supply system can comprise a two-zone gas distribution system, wherein the helium gas-gap pressure can be independently varied between the center and the edge of wafer 125.

In the embodiment shown in FIG. 1, substrate holder 120 can comprise an electrode 122 through which radio frequency (RF) power is coupled to the processing region 145. For example, substrate holder 120 can be electrically biased at a RF voltage via the transmission of RF power from a RF generator 130 through an optional impedance match network 132 to substrate holder 120. The RF electrical bias can serve to heat electrons to form and maintain plasma. In this configuration, the system 100 can operate as an RIE reactor, wherein the chamber and an upper gas injection electrode serve as ground surfaces.

Furthermore, the electrical bias of electrode 122 at a RF voltage may be pulsed using pulsed bias signal controller 131. The RF power output from the RF generator 130 may be pulsed between an off-state and an on-state, for example. Alternately, RF power is applied to the substrate holder electrode at multiple frequencies. Furthermore, impedance match network 132 can improve the transfer of RF power to plasma in plasma processing chamber 110 by reducing the reflected power. Match network topologies (e.g. L-type, π-type, T-type, etc.) and automatic control methods are well known to those skilled in the art.

Gas distribution system 140 may comprise a showerhead design for introducing a mixture of process gases. Alternatively, gas distribution system 140 may comprise a multi-zone showerhead design for introducing a mixture of process gases, and adjusting the distribution of the mixture of process gases above wafer 125. For example, the multi-zone showerhead design may be configured to adjust the process gas flow or composition to a substantially peripheral region above wafer 125 relative to the amount of process gas flow or composition to a substantially central region above wafer 125. In such an embodiment, gases may be dispensed in a suitable combination to form a highly uniform plasma within the chamber 110.

Vacuum pumping system 150 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 110.

In an embodiment, the source controller 155 can comprise a microprocessor, memory, and a digital I/O port capable of generating control voltages sufficient to communicate and activate inputs to processing system 100 as well as monitor outputs from plasma processing system 100. Moreover, source controller 155 can be coupled to and can exchange information with RF generator 130, pulsed bias signal controller 131, impedance match network 132, the gas distribution system 140, the gas supply 190, vacuum pumping system 150, as well as the substrate heating/cooling system (not shown), the backside gas supply system 126, and/or the electrostatic clamping system 128. For example, a program stored in the memory can be utilized to activate the inputs to the aforementioned components of processing system 100 according to a process recipe in order to perform a plasma assisted process, such as a plasma etch process or a post heating treatment process, on wafer 125.

In addition, the processing system 100 can further comprise an upper electrode 170 to which RF power can be coupled from RF generator 172 through optional impedance match network 174. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, Radial Line Slot Antenna (RLSA) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz. Moreover, source controller 155 is coupled to RF generator 172 and impedance match network 174 in order to control the application of RF power to upper electrode 170. The design and implementation of an upper electrode is well known to those skilled in the art. The upper electrode 170 and the gas distribution system 140 can be designed within the same chamber assembly, as shown. Alternatively, upper electrode 170 may comprise a multi-zone electrode design for adjusting the RF power distribution coupled to plasma above wafer 125. For example, the upper electrode 170 may be segmented into a center electrode and an edge electrode.

Depending on the applications, additional devices such as sensors or metrology devices can be coupled to the processing chamber 110 and to the source controller 155 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pull-down of structures (pulldown), slimming of structures (slimming), aspect ratio of structures (aspect ratio), line width roughness, substrate throughput, cost of ownership, and the like are achieved.

By modulating the applied power, typically through variation of the pulse frequency and duty ratio, it is possible to obtain markedly different plasma properties from those produced in continuous wave (CW). Consequently, RF power modulation of the electrodes can provide control over time-averaged ion flux and the ion energy.

Figure 2A:
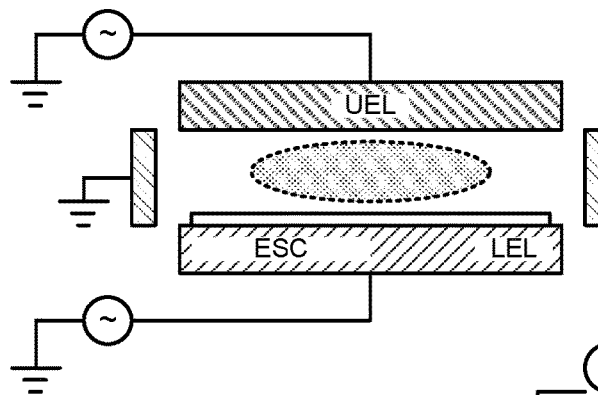
FIG. 2A is a schematic diagram illustrating one embodiment of an etch system configured to perform methods for surface modification to reduce side wall etch.

FIGS. 2A through 2D provide several plasma generating systems that may be used to facilitate plasma-excitation of a process gas. FIG. 2A illustrates a capacitively coupled plasma (CCP) system, wherein plasma is formed proximate a substrate between an upper plate electrode (UEL) and a lower plate electrode (LEL), the lower electrode also serving as an electrostatic chuck (ESC) to support and retain the substrate. Plasma is formed by coupling radio frequency (RF) power to at least one of the electrodes. As shown in FIG. 2A, RF power is coupled to both the upper and lower electrodes, and the power coupling may include differing RF frequencies. Alternatively, multiple RF power sources may be coupled to the same electrode. Moreover, direct current (DC) power may be coupled to the upper electrode.

Figure 2B:
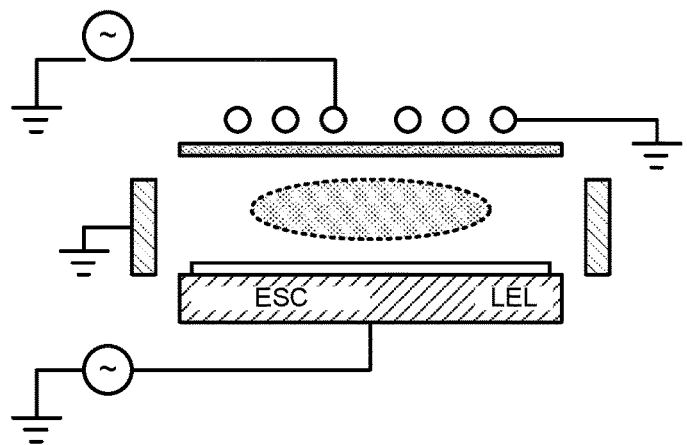
FIG. 2B is a schematic diagram illustrating one embodiment of an etch system configured to perform methods for surface modification to reduce side wall etch.

FIG. 2B illustrates an inductively coupled plasma (ICP) system, wherein plasma is formed proximate a substrate between an inductive element (e.g., a planar, or solenoidal/helical coil) and a lower plate electrode (LEL), the lower electrode also serving as an electrostatic chuck (ESC) to support and retain the substrate. Plasma is formed by coupling radio frequency (RF) power to the inductive coupling element. As shown in FIG. 2B, RF power is coupled to both the inductive element and lower electrode, and the power coupling may include differing RF frequencies.

Figure 2C:
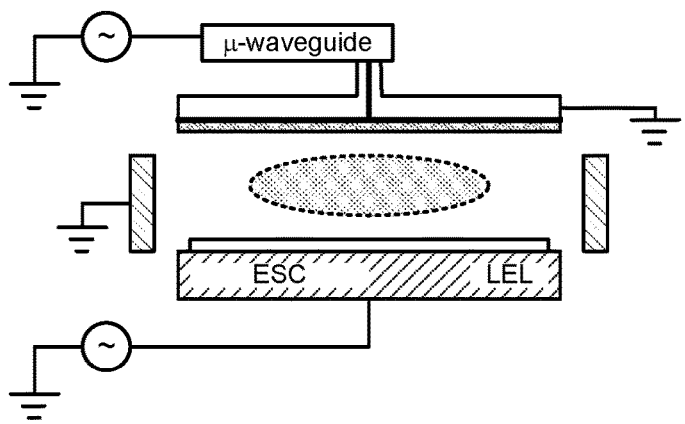
FIG. 2C is a schematic diagram illustrating one embodiment of an etch system configured to perform methods for surface modification to reduce side wall etch.

FIG. 2C illustrates a surface wave plasma (SWP) system, wherein plasma is formed proximate a substrate between a slotted plane antenna and a lower plate electrode (LEL), the lower electrode also serving as an electrostatic chuck (ESC) to support and retain the substrate. Plasma is formed by coupling radio frequency (RF) power at microwave frequencies through a waveguide and coaxial line to the slotted plane antenna. As shown in FIG. 2C, RF power is coupled to both the slotted plane antenna and lower electrode, and the power coupling may include differing RF frequencies.

Figure 2D:
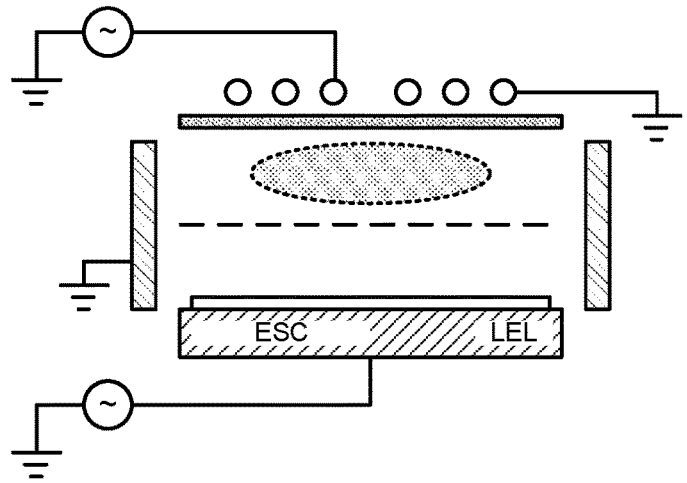
FIG. 2D is a schematic diagram illustrating one embodiment of an etch system configured to perform methods for surface modification to reduce side wall etch.

FIG. 2D illustrates remote plasma system, wherein plasma is formed in a region remote from a substrate and separated from the substrate by a filter arranged to impede the transport of charged particles from the remote plasma source to a processing region proximate the substrate. The substrate is supported by a lower plate electrode (LEL) that also serves as an electrostatic chuck (ESC) to retain the substrate. Plasma is formed by coupling radio frequency (RF) power to a plasma generating device adjacent the remotely located region. As shown in FIG. 2D, RF power is coupled to both the plasma generating device adjacent the remote region and lower electrode, and the power coupling may include differing RF frequencies.

The plasma processing systems of FIGS. 2A through 2D are intended to be illustrative of various techniques for implementing the stepped ion/radical process described. Other embodiments are contemplated including both combinations and variations of the systems described.

Figure 3A:
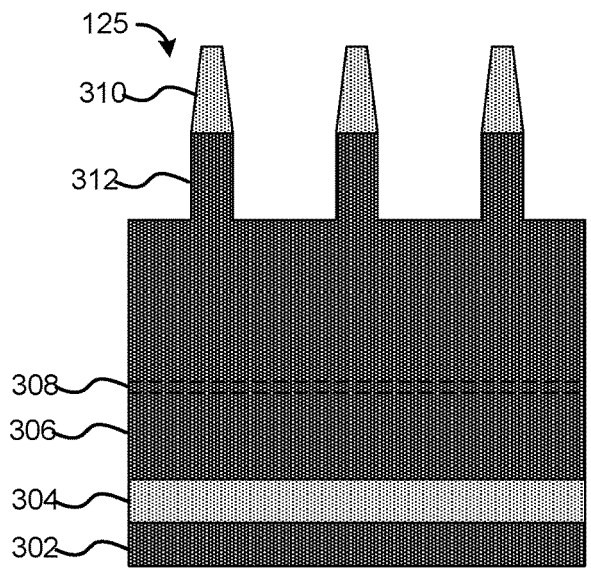
FIG. 3A is a schematic cross-section representation of one process for etching a substrate.

FIGS. 3A-3D illustrate a process flow for etching a feature in a substrate. In the process of FIG. 3A, a wafer 125 comprising a workpiece may be received in a processing chamber 110 as illustrated in FIG. 1. In such an embodiment, the workpiece may include a bulk substrate 302, comprising for example, silicon. A stopping layer 304 may be formed thereon. In one embodiment, the stopping layer 304 may be an oxide layer, but one of ordinary skill will recognize a variety of suitable stopping layer materials, including nitride layers and the like. Additionally, a silicon (Si) stack 306 may be formed on the stopping layer 304, and a device structure 308 may be formed in the Si stack 306. In one embodiment, the Si stack 306 may include an amorphous silicon (aSi) layer. In one embodiment, the device structure 308 includes a fin component of a fin field effect transistor (FinFET) device. In an embodiment, a hard mask layer 310 may be formed on the Si stack 306. In an embodiment, the hard mask layer 310 may be patterned using a patterned photoresist layer (not shown) or the like. In an embodiment, one or more features 312 may be formed in the Si stack 306 in a pattern defined by the hard mask layer 310.

Figure 3B:
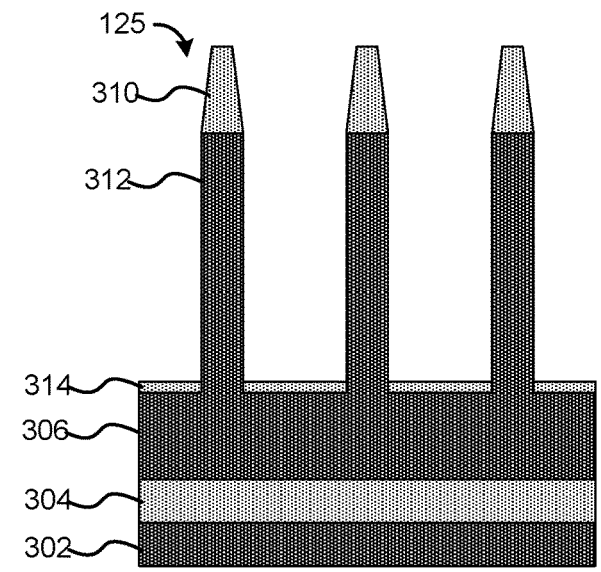
FIG. 3B is a schematic cross-section representation of one process for etching a substrate.
Figure 3C:
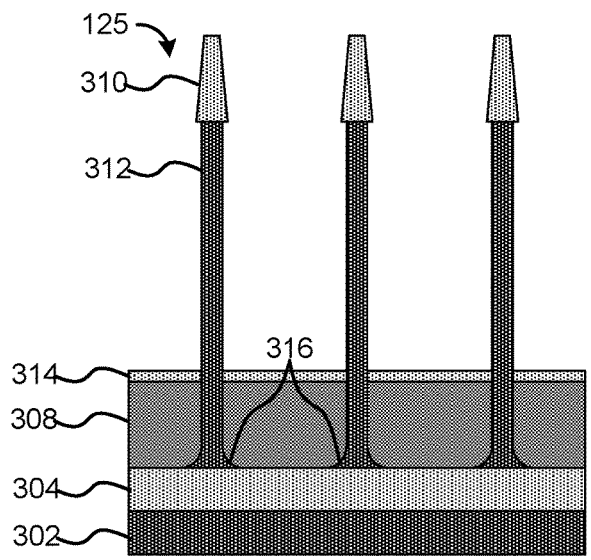
FIG. 3C is a schematic cross-section representation of one process for etching a substrate.

As shown in FIG. 3B, the features 312 may be etched until a mask layer 314 of the device structure 308 is reached. As shown in FIG. 3C, the features 312 are etched down to the stopping layer 304. In one embodiment, a different etch process may be used once the device structure 308 is reached, thereby protecting portions of the device structure 308. In certain embodiments, the etched features 312 may still include feet 316 in regions where the features 312 meet the stopping layer 304.

Figure 3D:
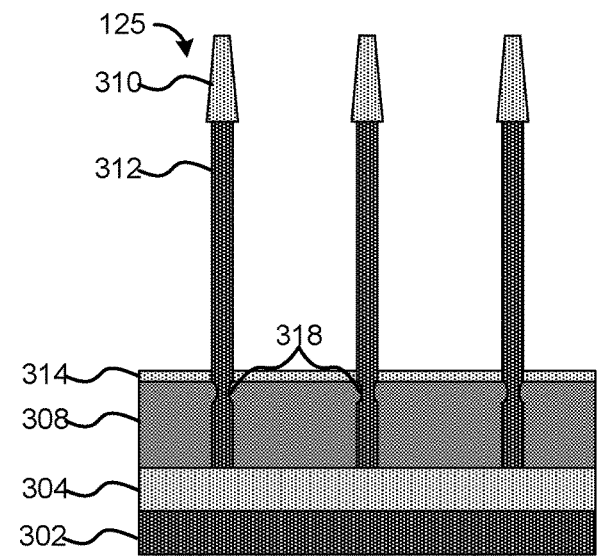
FIG. 3D is a schematic cross-section representation of one process for etching a substrate.

FIG. 3D illustrates a de-footing step, where the feet 316 are removed from the features. Unfortunately, conventional processes may cause degradation of the structure of the features during the de-footing process. For example, side wall etch may cause lateral deformation 318 of the features during the de-footing process. In particular, such a process may cause necking of the features 312 near the top of the device structure 308.

Figure 4:
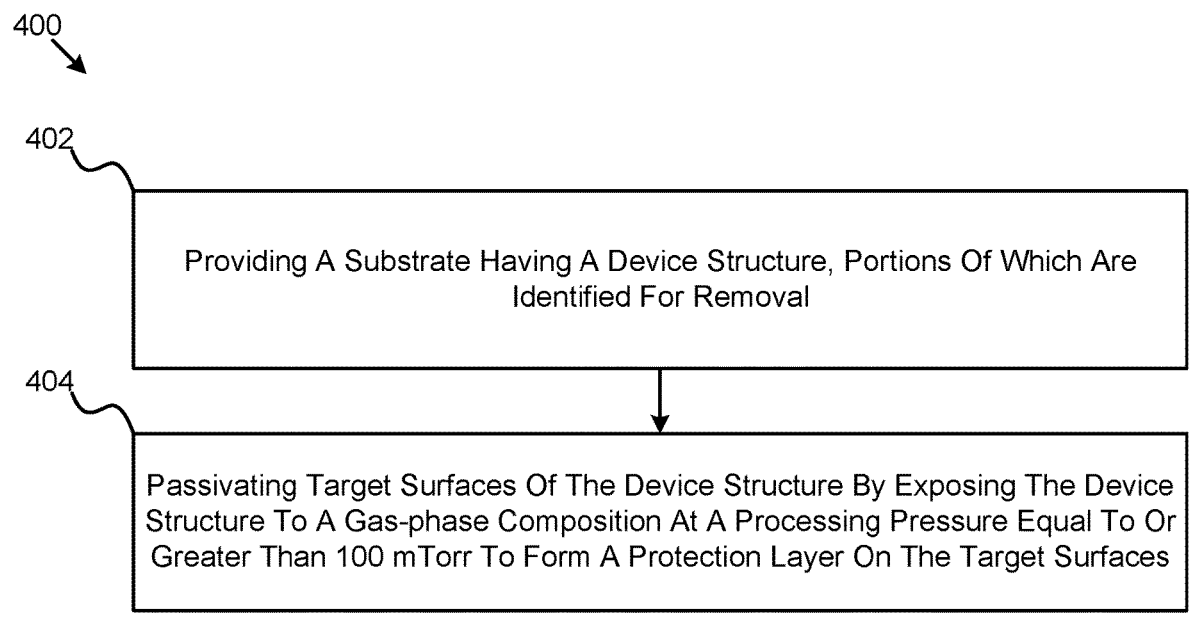
FIG. 4 is a flowchart diagram illustrating one embodiment of a method for surface modification to reduce side wall etch.

FIG. 4 illustrates one embodiment of a method 400 for surface modification to reduce side wall etch. As shown at block 402, the method 400 may include providing a substrate having a device structure, portions of which are identified for removal. Additionally, such a method 400 may include passivating target surfaces of the device structure by exposing the device structure to a gas-phase composition at a processing pressure equal to or greater than 100 mTorr to form a protection layer on the target surface, as shown at block 404.

FIGS. 5A-5F illustrate a process flow for implementing an embodiment of the method 400 described in FIG. 4. In an embodiment, the incoming workpiece includes the wafer 125 with the same or similar structures as those described in FIGS. 3A-3C. As described above, the wafer 125 may be received in a processing chamber. The wafer 125 may include a workpiece that includes a device structure 502, portions of which are identified for removal. For example, the device structure 502 may include a FinFET, a gate-all-around (GAA) FET, a nano-wire FET, a nano-sheet FET, or a complementary FET.

Figure 5A:
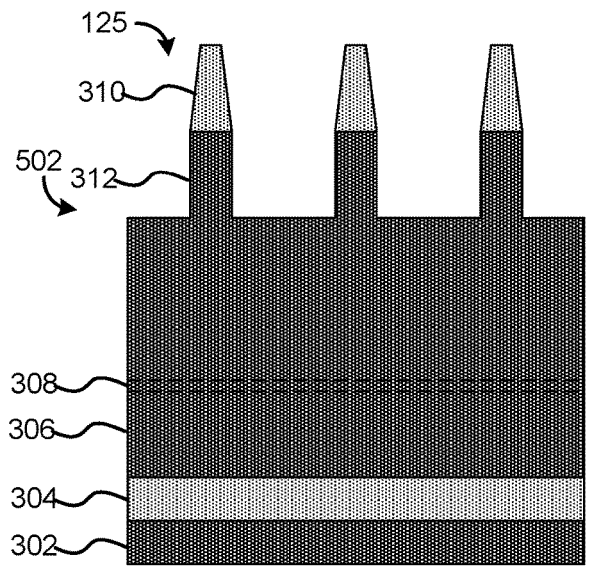
FIG. 5A is a schematic cross-section representation of one embodiment of a process for surface modification to reduce side wall etch.
Figure 5B:
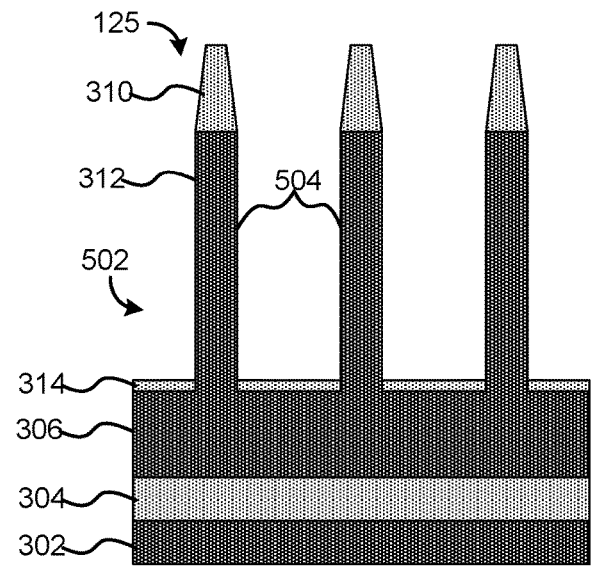
FIG. 5B is a schematic cross-section representation of one embodiment of a process for surface modification to reduce side wall etch.
Figure 5C:
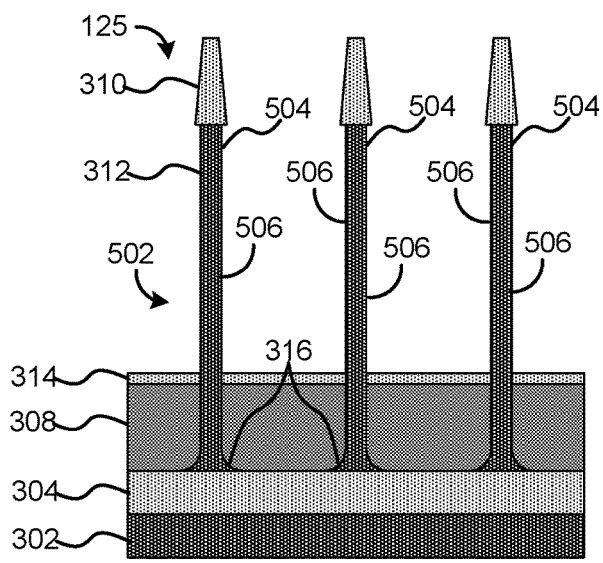
FIG. 5C is a schematic cross-section representation of one embodiment of a process for surface modification to reduce side wall etch.

As illustrated in FIG. 5B, the device structure 502 may include a fin component 308 of a FinFET device. Additionally, the device structure 502 may include one or more gates 504. In an embodiment, the gates 504 may be non-planar gates. In an embodiment, the target surface for the described process is a sidewall 506 of the one or more gates 504, as shown in FIG. 5C. During the process step of FIG. 5C, the features 312 are etched down to the stopping layer 304. In one embodiment, a different etch process may be used once the device structure 308 is reached, thereby protecting portions of the device structure 308. In certain embodiments, the etched features 312 may still include feet 316 in regions where the features 312 meet the stopping layer 304.

Figure 5D:
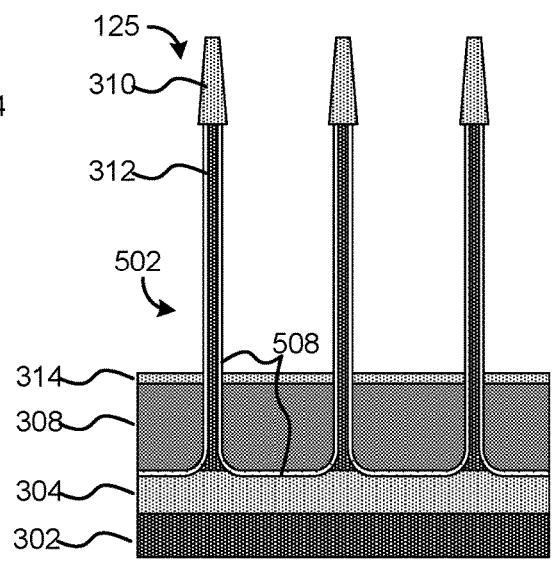
FIG. 5D is a schematic cross-section representation of one embodiment of a process for surface modification to reduce side wall etch.

In an embodiment of the processing step of FIG. 5D, a protection layer 508 is formed on a target surface of the workpiece. For example, the protection layer 508 may be formed on the sidewalls 506 of the gates 504. Additionally, the protection layer 508 may initially be formed on at least a portion of a surface of the stopping layer 304 and the feet 316 of the gates 504. In an embodiment, the protection layer 508 may be formed by passivating the target surface, including the sidewalls 506, by exposing the device structure to a gas-phase composition at a processing pressure equal to or greater than 100 mTorr. In another embodiment, the gas-phase composition may exhibit a ratio of radical content to ion content that is greater than 10-to-1. In an embodiment, the gas-phase composition may include nitrogen gas. Accordingly, in some embodiments, the protection layer 508 may also contain nitrogen.

Figure 5E:
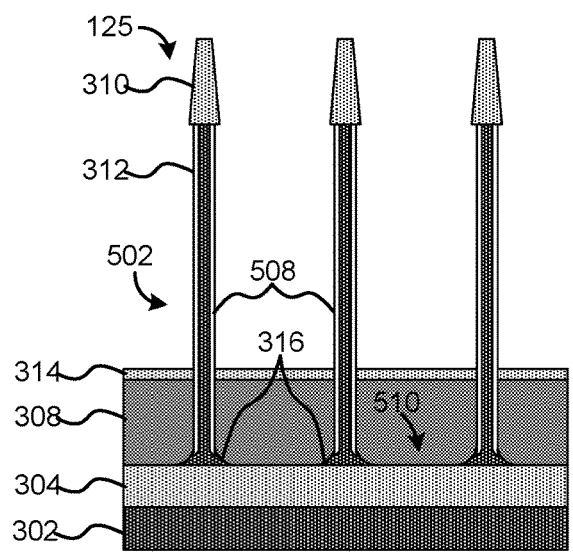
FIG. 5E is a schematic cross-section representation of one embodiment of a process for surface modification to reduce side wall etch.
Figure 5F:
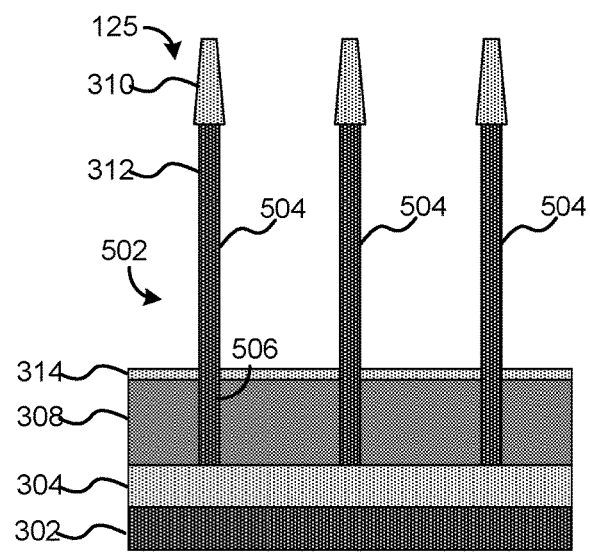
FIG. 5F is a schematic cross-section representation of one embodiment of a process for surface modification to reduce side wall etch.

As shown in FIG. 5E, a portion 510 of the protection layer 508 may be removed. In one embodiment, the portion 510 of the protection layer 508 that is removed is on horizontal surfaces proximate the base of the gate structure 504. As shown at FIG. 5F, the process may include removing the footing 316 of the gate structure 504, formed during the etching of the gate structure 504. As illustrated in FIG. 5E-5F, the protection layer 508 may protect the sidewalls 506 of the gate structure 504 during the footing removal process, thereby reducing or eliminating unintended sidewall under etch or other deformities in the sidewall surface, such as the lateral deformations 318 illustrated in FIG. 3D. As shown at step 5F, at least a portion of the protection layer 508 may be removed on select surfaces of the device structure. In one embodiment, the select surfaces may include the sidewall 506 of the gate structures 504.

Figure 6:
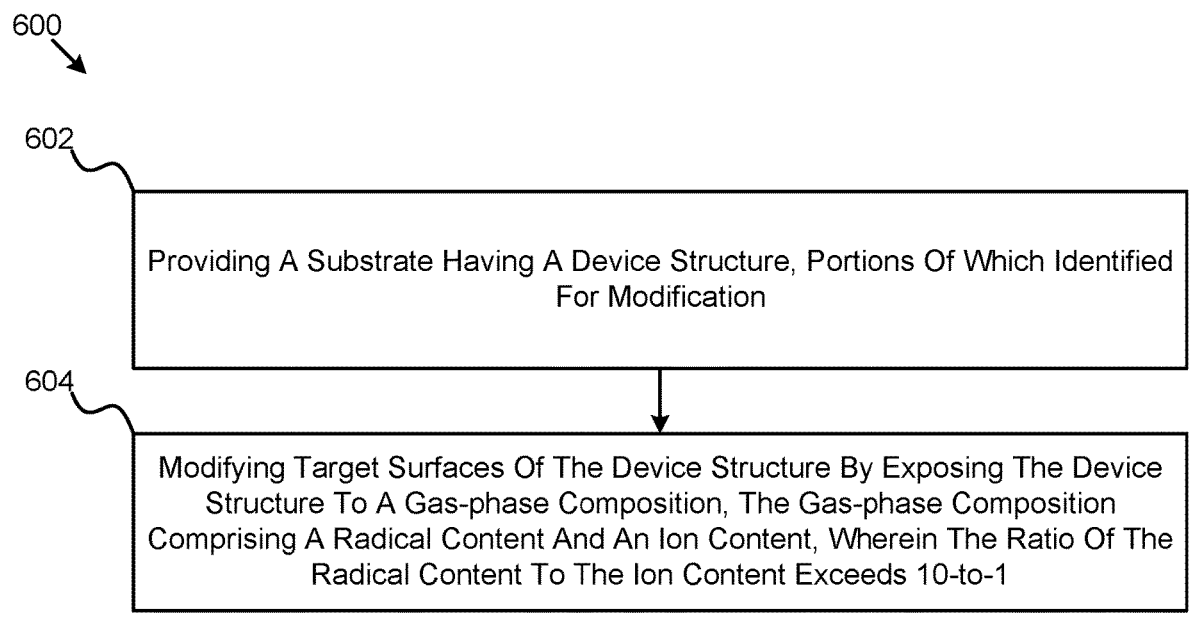
FIG. 6 is a flowchart diagram illustrating another embodiment of a method for surface modification to reduce side wall etch.

FIG. 6 illustrates another embodiment of a method 600 for surface modification to reduce side wall etch. In an embodiment, such a method 600 may include providing a substrate having a device structure, portions of which identified for removal, as shown in block 602. Additionally, the method 600 may include modifying target surfaces of the device structure by exposing the device structure to a gas-phase composition, the gas-phase composition comprising a radical content and an ion content, wherein the ratio of the radical content to the ion content exceeds 10-to-1, as shown in block 604.

FIG. 7A illustrates a high pressure surface modification process. In an embodiment, a high pressure surface modification process may be performed at a chamber pressure greater than or equal to 100 mTorr. In such an embodiment, the process may be performed with an $N_2$ plasma 706. One of ordinary skill will recognize that the described processes may be applied to, or used in association with, alternative plasma chemistries. In an embodiment, a protection layer 704 may be formed on the substrate 702 by the $N_2$ plasma 706. The $N_2$ plasma 706 may generate radicals 708 that bombard the substrate 702 to modify a surface of the substrate 702, thereby forming the protection layer 704. In an embodiment, the protection layer 704 may be formed on sidewalls of a gate structure of a FinFET device.

As shown in FIG. 7B, an $N_2$ plasma 706 may generate ions 710 and radicals 708. An $N_2$ plasma 706 at high pressure may generate more radicals 708 than ions 710, as shown in FIG. 7A. In one such embodiment, the ratio of radicals to ions in the plasma may be greater than 10:1. A low pressure $N_2$ plasma 706 may generate a greater number of ions 710, as shown in FIG. 7B. In an embodiment, treatment with radicals 708 in the $N_2$ plasma 706 may form a protection layer on the target surfaces.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of etching, comprising:
providing a substrate having a device structure, portions of which are identified for removal, wherein the device structure is provided above an underlying layer;
etching portions of the device structure to expose side surfaces of the device structure and to expose portions of the underlying layer, and wherein after etching the portions of the device structure, feet of the device structures are present in regions where the device structure meets the underlying layer;
passivating the side surfaces of the device structure by exposing the device structure to a gas-phase composition at a processing pressure equal to or greater than 100 mTorr to form a protection layer on the side surfaces, and wherein during passivating the side surfaces, the protection layer is formed on exposed portions of the underlying layer and the feet of the device structure;
removing the protection layer formed on the underlying layer and on the feet of the device structure to expose the underlying layer and the feet of the device structure, while leaving portions of the protection layer on the side surfaces of the device structure; and
removing the feet of the device structures while the side surfaces of the device structures are protected by the protection layer.

2. The method of claim 1, wherein the gas-phase composition includes nitrogen.

3. The method of claim 2, wherein plasma is formed to facilitate forming the protection layer on the side surfaces, wherein the protection layer contains nitrogen.

4. The method of claim 1, wherein the device structure includes a non-planar gate.

5. The method of claim 1, wherein the device structure includes a fin field-effect transistor (FinFET), a gate-all-around (GAA) field-effect transistor (FET), a nano-wire FET, a nano-sheet PET, or a complementary FET.

6. The method of claim 1, wherein the device structure includes a fin structure and a gate structure.

7. The method of claim 6, wherein the target side surfaces include sidewalls of the gate structure.

8. The method of claim 1, wherein the device structure includes gates and the side surfaces are side surfaces of the gates, and wherein the substrate includes a first mask and a second mask, and wherein the underlying layer is an etch stop layer; and
wherein the etching to expose the side surfaces includes etching through the first mask to expose upper portions of the side surfaces of the gates and to expose the second mask, and thereafter continuing to etch through the second mask to expose lower portions of the side surfaces of the gates and the etch stop with feet of the gates at an interface between the gates and exposed portions of the etch stop layer.

9. A method of etching, comprising:
providing a substrate having a device structure, portions of which are identified for modification, wherein the device structure is provided above an underlying layer;
etching portions of the device structure to expose side surfaces of the device structure and to expose portions of the underlying layer, and wherein after etching the portions of the device structure, feet of the device structure are present in regions where the device structure meets the underlying layer;
modifying the side surfaces of the device structure by exposing the device structure to a gas-phase composition, the gas phase composition comprising a radical content and an ion content, wherein the ratio of the radical content to the ion content exceeds 10-to-1, and wherein during the modifying, a protection layer is formed on the side surfaces of the device structure, exposed portions of the underlying layer and the feet of the device structure;
removing the protection layer formed on the underlying layer and on the feet of the device structure to expose the underlying layer and the feet of the device structure, while leaving portions of the protection layer on the side surfaces of the device structure; and removing the feet of the device structures while the side surfaces of the device structures are protected by the protection layer.

10. The method of claim 9, wherein the gas-phase composition includes nitrogen.

11. The method of claim 10, wherein plasma is formed to facilitate forming the protection layer on the side surfaces, wherein the protection layer contains nitrogen.

12. The method of claim 9, wherein the device structure includes a non-planar gate.

13. The method of claim 9, wherein the device structure includes a fin field-effect transistor (FinFET), a gate-all-around (GAA) field-effect transistor (FET), a nano-wire FET, a nano-sheet FET, or a complementary FET.

14. The method of claim 9, wherein the device structure includes a fin structure and a gate structure.

15. The method of claim 14, wherein the side surfaces include sidewalk of the gate structure.

16. The method of claim 9, wherein the device structure includes gates and the side surfaces are side surfaces of the gates, and wherein the substrate includes a first mask and a second mask, and wherein the underlying layer is an etch stop layer; and wherein the etching to expose the side surfaces includes etching through the first mask to expose upper portions of the side surfaces of the gates and to expose the second mask, and thereafter continuing to etch through the second mask to expose lower portions of the side surfaces of the gates and the etch stop with feet of the gates at an interface between the gates and exposed portions of the etch stop layer.

17. A method of etching comprising:

providing a substrate to be etched in forming a device structure, the device structure being at least one of a fin or a gate, the substrate including an etch stop layer beneath the device structure, a first mask and a second mask;

etching through the first mask to expose upper side surfaces of the device structure and to expose the second mask;

etching through the second mask to expose lower side surfaces of the device structure and to expose portions of the etch stop layer, and wherein after the exposing the etch stop layer, feet of the device structure are present at an interface between the device structure and the etch stop layer;

forming a protection layer including nitrogen on at least the lower side surfaces of the device structure, exposed portions of the etch stop layer, and the feet of the structure, wherein the forming of the protection layer is performed with a plasma at a pressure of at least 100 mTorr and with a radical content to ion content exceeding 10-to-1;

removing portions of the protection layer from the etch stop layer and the feet of the device structure while leaving portions of the protection layer on the lower side surfaces of the device structure; and removing the feet of the device structure while the lower side surfaces of the device structure are protected by the protection layer.

* * * * *

UNITED STATES PATENT AND TRADEMARK OFFICE
CERTIFICATE OF CORRECTION

PATENT NO. : 10,937,664 B2
APPLICATION NO. : 16/558865
DATED : March 2, 2021
INVENTOR(S) : Cedric Thomas et al.

It is certified that error appears in the above-identified patent and that said Letters Patent is hereby corrected as shown below:

In the Claims

In Column 10, Line 29, Claim 5, "a nano-sheet PET" should read --a nano-sheet FET--.

In Column 10, Line 32, Claim 7, delete "target".

In Column 11, Line 21, Claim 15, "sidewalk" should read --sidewalls--.

In Column 12, Lines 20-21, Claim 17, "the feet of the structure," should read --the feet of the device structure,--.

Signed and Sealed this
Twenty-seventh Day of September, 2022

Katherine Kelly Vidal
*Director of the United States Patent and Trademark Office*